United States Patent
Ohtsuki

(10) Patent No.: US 9,935,021 B2
(45) Date of Patent: Apr. 3, 2018

(54) METHOD FOR EVALUATING A SEMICONDUCTOR WAFER

(71) Applicant: SHIN-ETSU HANDOTAI CO., LTD., Tokyo (JP)

(72) Inventor: Tsuyoshi Ohtsuki, Annaka (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 211 days.

(21) Appl. No.: 14/890,687

(22) PCT Filed: Apr. 14, 2014

(86) PCT No.: PCT/JP2014/002100
§ 371 (c)(1),
(2) Date: Nov. 12, 2015

(87) PCT Pub. No.: WO2014/192215
PCT Pub. Date: Dec. 4, 2014

(65) Prior Publication Data
US 2016/0079130 A1    Mar. 17, 2016

(30) Foreign Application Priority Data
May 31, 2013   (JP) ............................... 2013-115550

(51) Int. Cl.
*H01L 21/66* (2006.01)
*H01L 29/06* (2006.01)
(52) U.S. Cl.
CPC .............. *H01L 22/14* (2013.01); *H01L 22/12* (2013.01); *H01L 29/0688* (2013.01)
(58) Field of Classification Search
None
See application file for complete search history.

(56) References Cited

U.S. PATENT DOCUMENTS 5,804,981 A * 9/1998 Lowell .................. H01L 22/20
                                                    257/E21.525
6,049,220 A * 4/2000 Borden .............. G01N 21/1717
                                                    257/E21.53
(Continued)

FOREIGN PATENT DOCUMENTS

CN            1551324 A     12/2004
CN          101529592 A      9/2009
(Continued)

OTHER PUBLICATIONS

Apr. 5, 2017 Search Report issued in Chinese Patent Application No. 2014800300343.
(Continued)

*Primary Examiner* — Paresh Patel
(74) *Attorney, Agent, or Firm* — Oliff PLC

(57) ABSTRACT

A method for evaluating a semiconductor wafer including preparing a reference wafer in which contamination element and amount of contamination are known, forming a plurality of cells including p-n junctions on the reference wafer, measuring junction leakage currents in the plurality of cells on the reference wafer to acquire a distribution of the junction leakage currents of the reference wafer, associating the distribution of the junction leakage currents of the reference wafer with a contamination element, forming a plurality of cells including p-n junctions on a wafer to be measured, measuring junction leakage currents in the plurality of cells on the wafer to be measured to acquire a distribution of the junction leakage currents of the wafer to be measured, and identifying a contamination element of the wafer to be measured based on the association.

8 Claims, 7 Drawing Sheets

(56) References Cited

U.S. PATENT DOCUMENTS

| | | | |
|---|---|---|---|
| 2004/0031997 A1* | 2/2004 | Nakanishi | H01L 22/34 257/408 |
| 2004/0212016 A1 | 10/2004 | Yasui et al. | |
| 2008/0302295 A1 | 12/2008 | Kotooka et al. | |
| 2010/0022038 A1* | 1/2010 | Ohtsuki | H01L 22/14 438/17 |
| 2011/0019494 A1 | 1/2011 | Tsuda et al. | |
| 2012/0293793 A1 | 11/2012 | Uchino et al. | |
| 2015/0145551 A1* | 5/2015 | Ohtsuki | H01L 22/34 324/762.01 |

FOREIGN PATENT DOCUMENTS

| | | |
|---|---|---|
| JP | 2011-100909 A | 5/2011 |
| JP | 2013-008869 A | 1/2013 |
| TW | 200625494 A | 7/2006 |

OTHER PUBLICATIONS

Jul. 15, 2014 International Search Report issued in International Patent Application No. PCT/JP2014/002100.
Jun. 15, 2016 Search Report issued in Taiwanese Patent Application No. 103115727.

* cited by examiner

METHOD FOR EVALUATING A SEMICONDUCTOR WAFER

BACKGROUND OF THE INVENTION

1. Field of the Invention

The present invention relates to a method for evaluating a semiconductor wafer, and more particularly to a method for evaluating a semiconductor wafer by measuring a junction leakage currents.

2. Description of the Related Art

With miniaturization and advance in performance of a memory, a solid-state image pickup device such as a CCD and the like, to improve product yields, enhancement of quality of a silicon wafer as a material has been demanded, and various kinds of silicon wafers coping with such a demand have been developed. In particular, crystallinity of a wafer surface portion that is considered to directly exert its influence on product characteristics is important and, as countermeasures, 1) a high-temperature treatment that is performed in an atmosphere containing an inert gas or hydrogen, 2) reduction of grown-in defects by improving pulling conditions, and 3) an epitaxial growth wafer or the like are developed.

As a conventional method for evaluating electrical characteristics of silicon wafer surface quality, oxide dielectric breakdown voltage (GOI) evaluation has been used. According to this evaluation, a gate oxide film is formed on a silicon wafer surface by thermal oxidation, electrical stress is applied to a silicon oxide film as an insulator by forming an electrode on the gate oxide film, and silicon surface quality is evaluated based on a degree of insulation. That is, if defects or metal impurities are present on the original silicon wafer surface, they are taken into the silicon oxide film by the thermal oxidation, or an oxide film according to a surface shape is formed, and a non-uniform insulator is produced, thus degrading insulation properties. This is reliability of the gate oxide film of an MOSFET in an actual device, and various wafers have been developed for improvement of the above insulation properties. However, even if the GOI has no problem, a reduction in device yield can naturally happen, but such phenomena often occur in recent years with advance in integration of devices in particular.

Among others, in a solid-state image pickup device, for example, when a reduction in, e.g., dark current and an improvement in sensitivity are considered, reducing a junction leakage current caused due to a wafer leads to a decrease in dark current, which eventually contributes to an improvement in device characteristics. When metal contamination is a main cause in particular, with advance in performance of device in recent years, small amount of metal contamination has exerted an influence. On the other hand, in chemical analysis, although an approach for high sensitivity has enabled detection of various kinds of metals, as matters now stand, it is very difficult to grasp which metal in metallic elements detected by the chemical analysis considerably exerts its influence on an actual device or junction leakage.

As a method for identifying such a contamination metal that exerts its influence on the junction leakage, as described in Patent Literature 1, the contamination metal can be identified from temperature dependence characteristics of junction leakage currents.

CITATION LIST

Patent Literature

Patent Literature 1: Japanese Unexamined Patent Application Publication (kokai) No. 2013-008869

SUMMARY OF THE INVENTION

Problems to be Solved by the Invention

However, as a result of an investigation effected by the present inventor, he has discovered a problem that, according to the method disclosed in Patent Literature 1, junction leakage currents at a plurality of temperatures must be measured, thereby the measurement takes time, and a plurality of levels are formed depending on contamination element, thereby a high accuracy is required for identification.

In view of the above-described problem, it is an object of the present invention to provide a method for evaluating a semiconductor wafer that enables highly accurately evaluating junction leakage current characteristics of a high-quality wafer used for a product whose yield ratio is affected by quality of a wafer like a solid-state image pickup device, e.g., a CCD or a CMOS sensor and enables facilitating identification of a metallic element that can be a cause of leakage due to metal contamination.

Means for Solving the Problems

To achieve this object, according to the present invention, there is provided a method for evaluating a semiconductor wafer by using junction leakage currents, including preparing a reference wafer in which contamination element and amount of contamination are known, forming a plurality of cells including p-n junctions on the reference wafer, measuring junction leakage currents in the plurality of cells on the reference wafer to acquire a distribution of the junction leakage currents of the reference wafer, associating the distribution of the junction leakage currents of the reference wafer with a contamination element, forming a plurality of cells including p-n junctions on a wafer to be measured, measuring junction leakage currents in the plurality of cells on the wafer to be measured to acquire a distribution of the junction leakage currents of the wafer to be measured, and identifying a contamination element of the wafer to be measured based on the association.

As described above, in the reference wafer in which contamination element and amount of contamination are known, when the distribution of the junction leakage currents and the contamination element are associated with each other in advance and the contamination element is identified from the distribution of the junction leakage currents provided by measuring the junction leakage current of the wafer to be measured based on the association, the junction leakage current characteristics of the high-quality wafer can be highly accurately evaluated, and the identification of the metallic element that can cause leakage due to metal contamination can be facilitated.

Here, it is preferable that an amount of contamination of the wafer to be measured is $1\times10^7$ atoms/cm$^2$ or more and less than $3\times10^8$ atoms/cm$^2$ in terms of surface density.

As described above, when the amount of contamination of the wafer to be measured is $1\times10^7$ atoms/cm$^2$ or more and less than $3\times10^8$ atoms/cm$^2$ in terms of surface concentration, the contamination element can be assuredly identified.

Further, it is preferable to associate the distribution of the junction leakage currents of the reference wafer with the contamination element such that a peak value of the junction leakage current distribution of the reference wafer is associated with the contamination element.

As described above, by associating the peak value of the junction leakage current distribution of the reference wafer with the contamination element, the contamination element can be assuredly identified.

Furthermore, it is preferable to store in a database the association of the peak value of the junction leakage current distribution of the reference wafer and the contamination element in advance and to identify the contamination element based on the association stored in the database at the time of identifying the contamination element of the wafer to be measured.

As described above, at the time of identifying the contamination element of the wafer to be measured, by identifying the contamination element based on the association stored in the database, the contamination element can be more efficiently identified.

Effect of the Invention

As described above, according to the present invention, identifying the contamination element from the distribution of junction leakage currents provided by measuring the junction leakage currents of the wafer to be measured based on the association between the distribution of the junction leakage currents and the contamination element provided in the reference wafer in advance enables highly accurately evaluating junction leakage current characteristics of a high-quality wafer, thus facilitating the identification a metallic element that can cause leakage due to metal contamination.

DETAILED DESCRIPTION OF THE PREFERRED EMBODIMENTS

Although an embodiment of the present invention will now be described hereinafter with reference to the drawings, the present invention is not restricted thereto.

As described above, as a method for identifying a contamination metal that exerts its influence on junction leakage, the contamination metal can be identified from temperature dependence characteristics of junction leakage currents, but this method has problem that this method requires measuring the junction leakage currents at a plurality of temperatures, thereby the measurement takes time, and a plurality of levels are formed depending on contamination element, thereby the identification requires a high accuracy, and hence there is a room for improvement in this method.

Thus, the present inventor has repeatedly conducted earnest investigation about a method for evaluating a semiconductor wafer that enables highly accurately evaluating junction leakage current characteristics of a high-quality wafer and facilitating identification of a metallic element that can be a cause of leakage due to metal contamination.

Consequently, he has found that associating a distribution of junction leakage currents with a contamination element in a reference wafer in which contamination element and amount of contamination are known in advance and identifying the contamination element based on the association from the distribution of the junction leakage currents provided by measuring junction leakage currents of a wafer to be measured enables highly accurately evaluating junction leakage current characteristics of a high-quality wafer and facilitating identification of a metallic element that can be a cause of leakage due to metal contamination, thereby bringing the present invention to the completion.

A method for evaluating a semiconductor wafer according to the present invention will now be described hereinafter with reference to FIG. 1.

Figure 1:
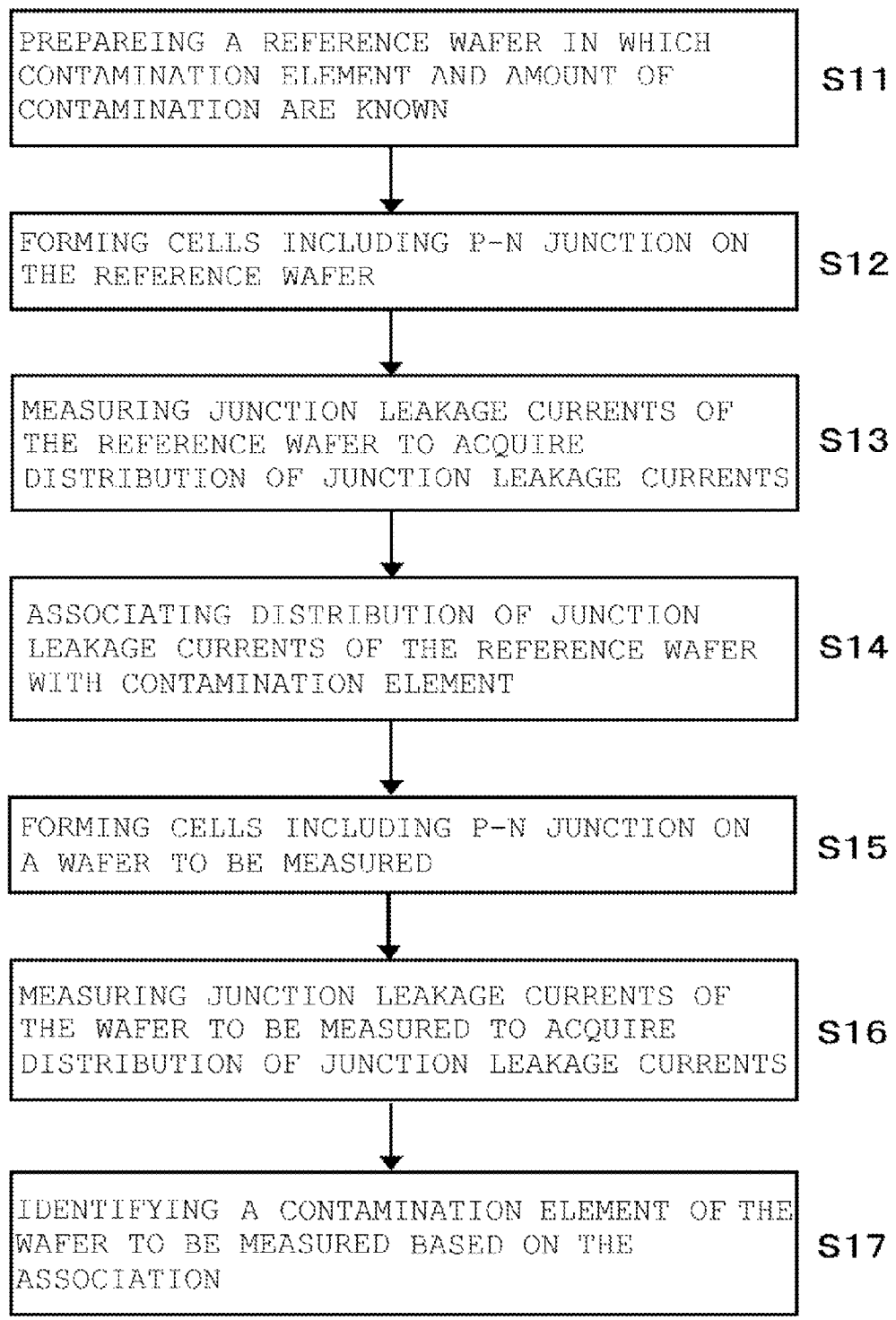
FIG. 1 shows a flow depicting an example of a method for evaluating a semiconductor wafer according to the present invention.

FIG. 1 shows a flow depicting an example of a method for evaluating a semiconductor wafer according to the present invention.

First, a reference wafer in which contamination element and amount of contamination are known is prepared (see a step S11 in FIG. 1).

Specifically, for example, silicon epitaxial growth is performed on a silicon wafer in an epitaxial growth reactor (which will be referred to as a reactor hereinafter) which is at a predetermined contamination level, and a surface of this epitaxial wafer is chemically analyzed, thereby revealing a contamination element and an amount of contamination of the epitaxial wafer. This chemical analysis can be conducted by etching the wafer surface with droplets of nitrohydrofluoric acid, collecting the droplets of nitrohydrofluoric acid, and performing analysis with the use of an ICP-MS (inductively-coupled plasma mass spectrometer).

The silicon epitaxial growth is performed on the silicon wafer in the same reactor as that described above, whereby an epitaxial wafer is provided. This epitaxial wafer is regarded as a reference wafer in which contamination element and amount of contamination are known.

Here, the silicon epitaxial growth can be performed while effecting boron doping such that a silicon epitaxial layer can be formed into a p type having a specific resistivity of, e.g., 10 Ω·cm.

Then, a cell including p-n junction is formed on the reference wafer (see a step S12 in FIG. 1).

Specifically, for example, a silicon oxide film 200 nm thick is formed on a surface of the reference wafer prepared at the step S11 in FIG. 1 by pyrogenic oxidation (wet oxidation) at 1000° C. for 90 minutes.

Then, a resist film is applied to the wafer, and a pattern is formed on the resist film by photolithography. It is to be noted that, as the resist film, a negative type resist (a resist that is hardened at a position to which light is applied) can be used. In the wafer having the resist film on which this pattern is formed, a silicon oxide film in a region having no resist film is etched with a buffered HF solution.

Subsequently, the resist film is removed with the use of a mixture of sulfuric acid and hydrogen peroxide, and RCA cleaning is performed.

With using the silicon oxide film as a mask, boron is ion-implanted with an accelerating voltage of 55 keV and a dosage of $2\times10^{12}$ atoms/cm$^2$, and recovery annealing is carried out in a nitrogen atmosphere at 1000° C. to form a deep p-type layer.

Then, phosphorus glass is applied to this wafer, and phosphorus is diffused from the wafer surface to form a shallow n-type layer with using the silicon oxide film as a mask.

In this manner, a p-n junction can be formed.

It is to be noted that forming a plurality of regions which are not covered with resist film by the photolithography enables forming a plurality of cells including p-n junction.

Then, junction leakage currents at a plurality of positions on the reference wafer are measured to acquire a distribution of the junction leakage currents (see a step S13 in FIG. 1).

Specifically, for example, an n-type region electrode electrically connected to an n-type region of a cell including the p-n junction on the reference wafer is formed, a p-type region electrode electrically connected to a p-type region of the cell including the p-n junction on the reference wafer is formed, potential are supplied to the n-type region electrode and the p-type electrode such that a reverse bias can be applied to the p-n junction portions, and junction leakage currents are measured.

Here, it is preferable to acquire data of 500 or more positions to provide a distribution of leakage currents.

If defect density is low, measurement must be carried out many times to detect failure positions on the wafer. Since a specific number of times of measurement depends on each semiconductor wafer, it is preferable to appropriately set an optimum number in accordance with a demanded semiconductor wafer.

Subsequently, the distribution of junction leakage currents of the reference wafer is associated with a contamination element (see a step S14 in FIG. 1).

Specifically, for example, a frequency distribution of junction leakage currents of all cells is created, a peak value is obtained, and a peak value (i.e., a value of the junction leakage current having the highest appearance frequency) in the distribution of the junction leakage currents is associated with the contamination element provided by the chemical analysis conducted at the step S11 in FIG. 1. At this time, intervals in the creation of the frequency distribution are appropriately set such that the peak value can be obtained.

As described above, associating the peak value of the junction leakage current distribution of the reference wafer with the contamination element enables assuredly identifying the contamination element.

Here, it is desirable to store the association between the peak value of the junction leakage current distribution and the contamination element in a database. It is desirable to record the peak value of the junction leakage current distribution in this database in accordance with each metallic element.

As described above, when the association between the peak value of the junction leakage current distribution and the contamination element is stored in the database, the contamination element can be more efficiently identified at the time of identifying the contamination element of the wafer to be measured.

Then, each cell including a p-n junction is formed on the wafer to be measured (see a step S15 in FIG. 1).

Specifically, for example, like a case where the cell including the p-n junction is formed on the reference wafer, the cell including the p-n junction can be formed on the wafer to be measured.

Subsequently, junction leakage currents at a plurality of positions on the wafer to be measured are measured to acquire a distribution of the junction leakage currents (see a step S16 in FIG. 1).

Specifically, for example, like a case where junction leakage currents at a plurality of positions on the reference wafer are measured to acquire a distribution of the junction leakage currents, junction leakage currents at a plurality of positions on the wafer to be measured can be measured to acquire a distribution of the junction leakage currents.

Further, like the reference wafer, it is necessary to acquire data of a plurality of positions rather than data of one position to obtain a distribution of the leakage currents. That is because a failure position on the wafer cannot be necessarily detected by the measurement at one position.

When the defect density is low, the measurement must be performed many times. Since a specific number of times of the measurement is dependent on semiconductor wafer, it is preferable to appropriately set an optimum number in accordance with a demanded semiconductor wafer.

Then, a contamination element of the wafer to be measured is identified based on the association (see a step S17 in FIG. 1).

Specifically, for example, a contamination element of the wafer to be measured is identified based on the association carried out at the step S14 in FIG. 1 from the distribution of the junction leakage currents of the wafer to be measured obtained at the step S16 in FIG. 1.

At this time, it is preferable to identify the contamination element of the wafer to be measured from the peak value of the distribution of the junction leakage currents of the wafer to be measured.

As described above, by identifying the contamination element of the wafer to be measured from the peak value of the distribution of the junction leakage currents of the wafer to be measured, the contamination element can be assuredly identified.

Here, it is desirable to identify the contamination element of the wafer to be measured based on the association between the peak value of the distribution of the junction leakage currents and the contamination element stored in the database.

By identifying the contamination element of the wafer to be measured based on the association between the peak value of the distribution of the junction leakage currents and the contamination element stored in the database in this manner, the contamination element can be more efficiently identified.

By identifying the contamination element of the wafer to be measured in this manner, a target of contamination removal can be clarified.

A change in peak value of the distribution of the junction leakage currents depending on a contamination element will now be explained with reference to FIG. 2.

Figure 2:
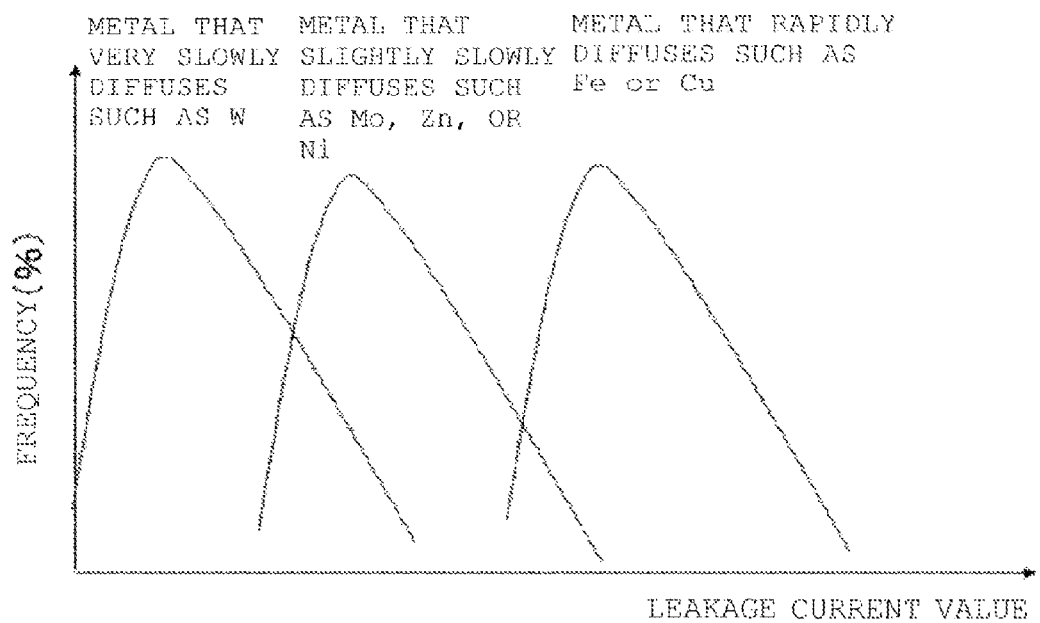
FIG. 2 is a conceptual view for explaining that a peak value of a distribution of junction leakage currents varies depending on contamination element.

Considering that metal contamination comes from outside and a device is usually formed in the vicinity of a silicon wafer surface, a metal in which leakage currents are distributed mainly at a high value rapidly diffuses (for example, Fe or Cu as shown in FIG. 2). That is, the above metal diffuses and spreads on the entire wafer and, if it exerts its influence on a device, contamination has already spread on not only the surface but also the entire wafer, and the junction leakage current value eventually increases.

On the other hand, although a metal that slightly slowly diffuses (for example, Mo, Zn, or Ni as shown in FIG. 2) does not come from outside so much, by staying near the surface, the above metal exerts its influence on a junction leakage current value accordingly.

Furthermore, although a metal that very slowly diffuses (for example, W as shown in FIG. 2) is detected by chemical analysis of a silicon surface, the above metal does not diffuse to the inside, its influence on a junction leakage current value is very imperceptible, and the junction leakage current value eventually decreases.

As described above, since the junction leakage current value varies depending on a diffusion velocity of a contamination element, if the distribution of the junction leakage currents is associated with the contamination element in advance, the contamination element that can be a cause of a junction leakage current failure of the wafer to be measured can be identified based on this association from the distribution of the junction leakage currents of the wafer to be measured.

EXPERIMENTAL EXAMPLES

The present invention will now be more specifically described hereinafter with reference to experimental examples, but the present invention is not restricted thereto.

Experimental Example 1

Silicon epitaxial growth was performed on 10 silicon wafers in each of two reactors in which the contamination level in one reactor is different from that in other reactor. In the epitaxial growth, trichlorosilane was used as a source gas, and an epitaxial layer of 5 μm was formed at a growth temperature of 1050° C.

Then, p-n junction structures were formed at 900 positions by the above-described method, and subsequently junction leakage characteristics were evaluated.

Figure 3A:
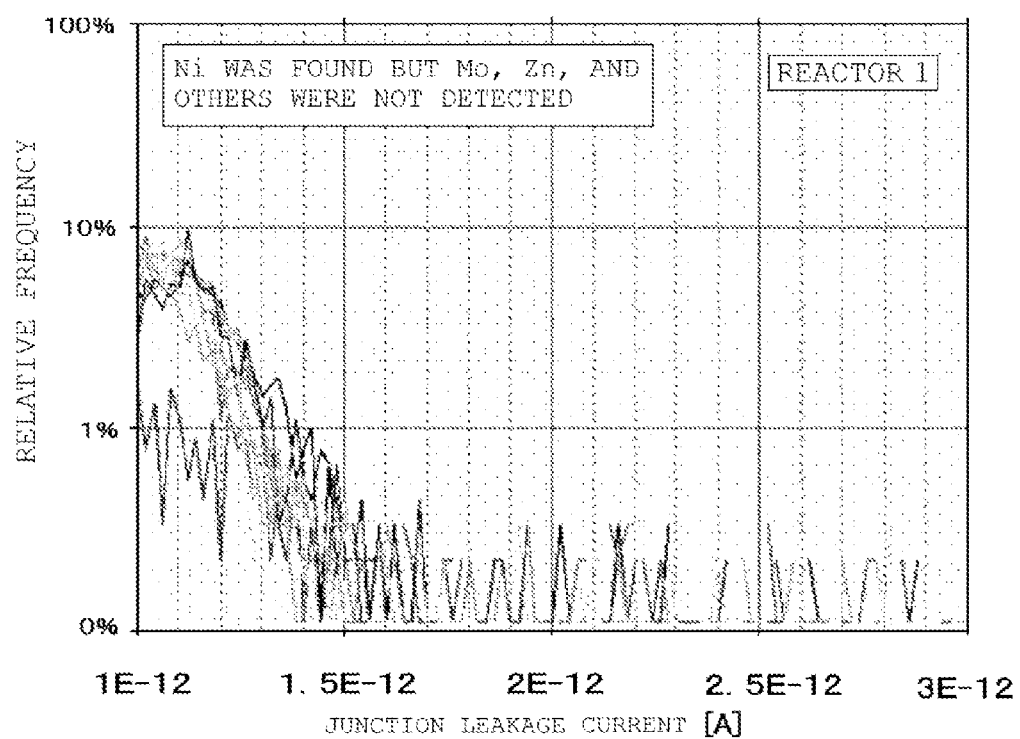
FIG. 3a is a view showing a distribution of junction leakage currents according to Experimental Example 1.
Figure 3B:
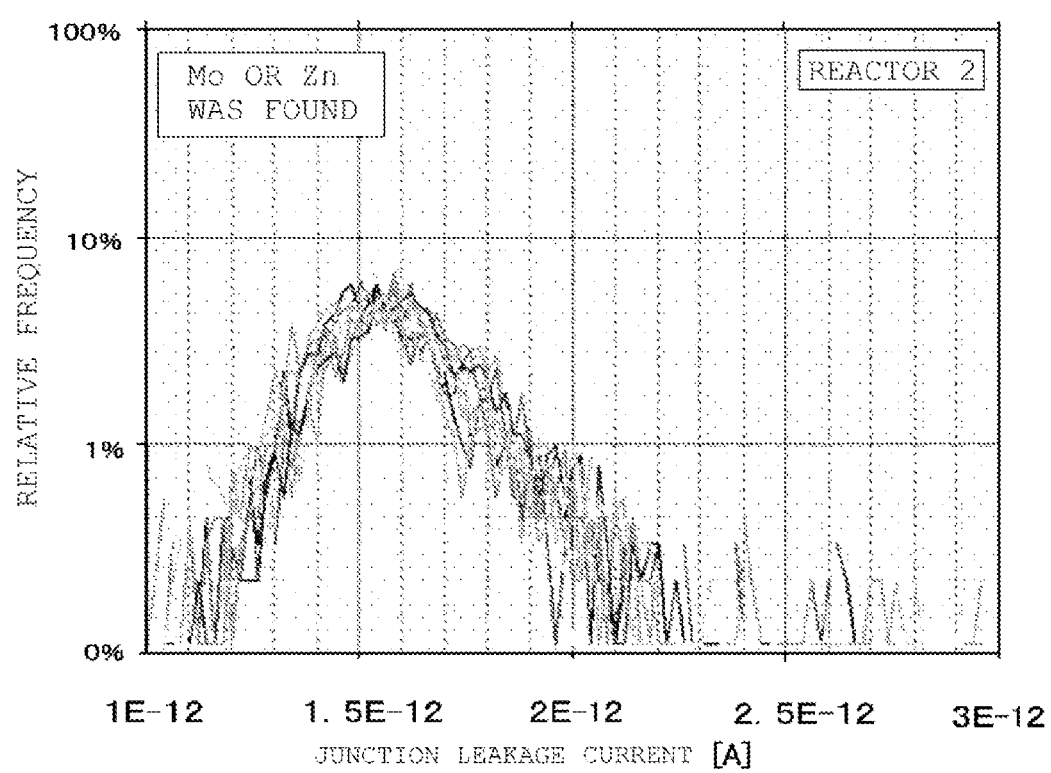
FIG. 3b is a view showing another distribution of the junction leakage currents according to Experimental Example 1.

FIG. 3a shows a distribution of junction leakage currents of the wafers subjected to the epitaxial growth in the reactor 1, and FIG. 3b shows a distribution of junction leakage currents of the wafers subjected to the epitaxial growth in the reactor 2.

As shown in FIG. 3a and FIG. 3b, a difference between the reactors in which the epitaxial growth was performed leads to a difference between distributions of the junction leakage currents.

Moreover, the similar four silicon wafers were prepared, the epitaxial growth was performed to two silicon wafers in each of the two reactors in which the contamination level in one reactor is different from that in other reactor under the same conditions, and surfaces of resultant epitaxial wafers were subjected to chemical analysis.

Consequently, Mo or Zn having density of approximately $1 \times 10^8$ atoms/cm$^2$ was detected from both the epitaxial wafers subjected to the epitaxial growth in the same reactor (the reactor 2) as that in which the wafers whose junction leakage current values were concentrated in the vicinity of $1.5 \times 10^{-12}$ A were subjected to the epitaxial growth.

Additionally, although Mo or Zn was not detected from both the epitaxial wafers subjected to the epitaxial growth in the same reactor (the reactor 1) as that in which the wafers whose junction leakage current values were concentrated in approximately $1 \times 10^{-12}$ A were subjected to the epitaxial growth, a small amount of Ni ($5 \times 10^7$ atoms/cm$^2$) was detected.

Experimental Example 2

10 silicon wafers were prepared like Experimental Example 1, epitaxial growth was performed in a reactor (a reactor 3) which is at a contamination level different from those of the reactors used in Experimental Example 1, then p-n junction structures were fabricated like Experimental Example 1, and thereafter junction leakage characteristics were evaluated.

Figure 4:
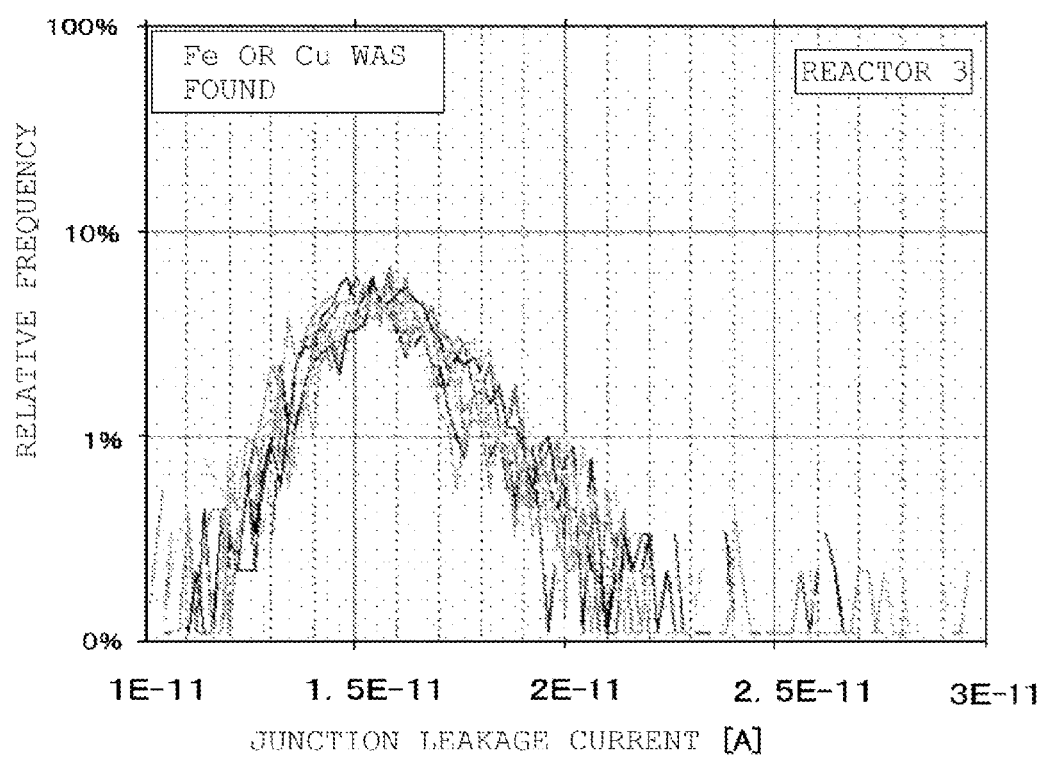
FIG. 4 is a view showing a distribution of junction leakage currents according to Experimental Example 2.

FIG. 4 shows a distribution of junction leakage currents of the wafers subjected to the epitaxial growth in the reactor 3.

As shown in FIG. 4, all the wafers show a result that junction leakage current values are concentrated in the vicinity of $1.5 \times 10^{-11}$ A.

Further, two similar silicon wafers were prepared, epitaxial growth was performed in the reactor 3 under the same conditions, and surfaces of resultant epitaxial wafers were subjected to chemical analysis.

Consequently, Fe or Cu having density of approximately $1 \times 10^8$ atoms/cm$^2$ was detected from both the wafers.

Experimental Example 3

10 silicon wafers were prepared like Experimental Example 1, epitaxial growth was performed in a reactor (a reactor 4) which is at a contamination level different from those of the reactors used in Experimental Example 1 and Experimental Example 2, then p-n junction structures were fabricated like Experimental Example 1, and thereafter junction leakage characteristics were evaluated.

Figure 5:
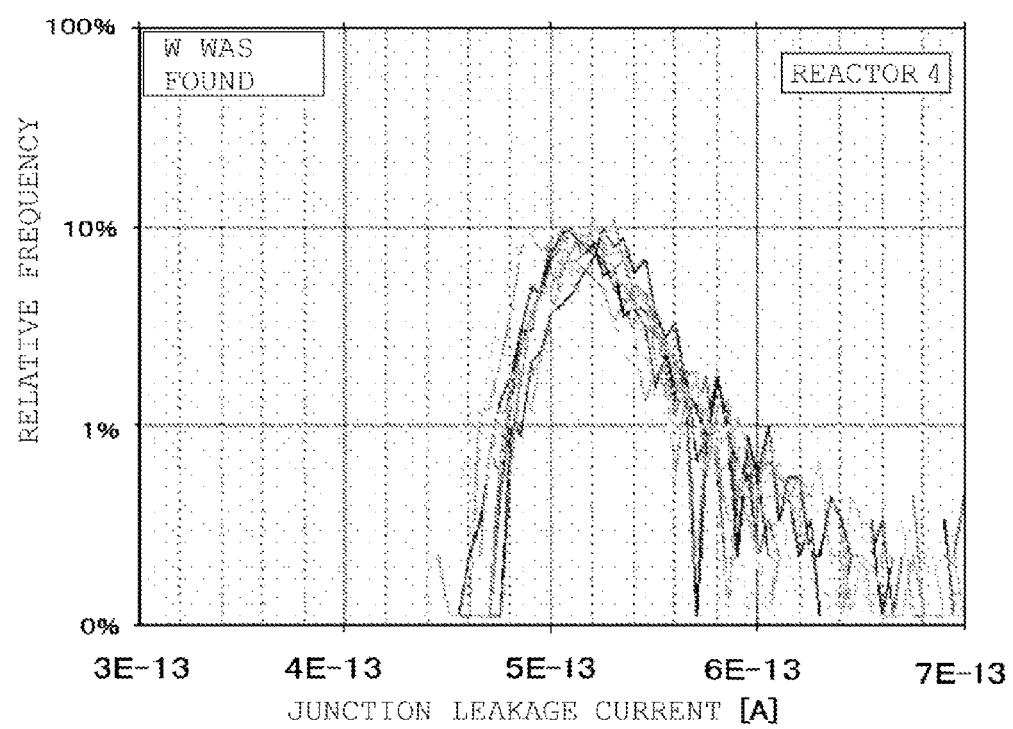
FIG. 5 is a view showing a distribution of junction leakage currents according to Experimental Example 3.

FIG. 5 shows a distribution of junction leakage currents of the wafers which are subjected to the epitaxial growth in the reactor 4.

As shown in FIG. 5, all the wafers show a result that junction leakage current values are concentrated in the vicinity of $5.2 \times 10^{-13}$ A.

Furthermore, two similar silicon wafers were prepared, epitaxial growth was performed in the reactor 4 under the same conditions, and surfaces of resultant epitaxial wafers were subjected to chemical analysis.

Consequently, W having density of approximately $1 \times 10^8$ atoms/cm$^2$ was detected from both the wafers.

Experimental Example 4

10 silicon wafers were prepared like Experimental Example 1, epitaxial growth was performed in a reactor (a reactor 5) which is at a contamination level different from those of the reactors used in Experimental Example 1 to Experimental Example 3, then p-n junction structures were fabricated like Experimental Example 1, and thereafter junction leakage characteristics were evaluated.

Figure 6:
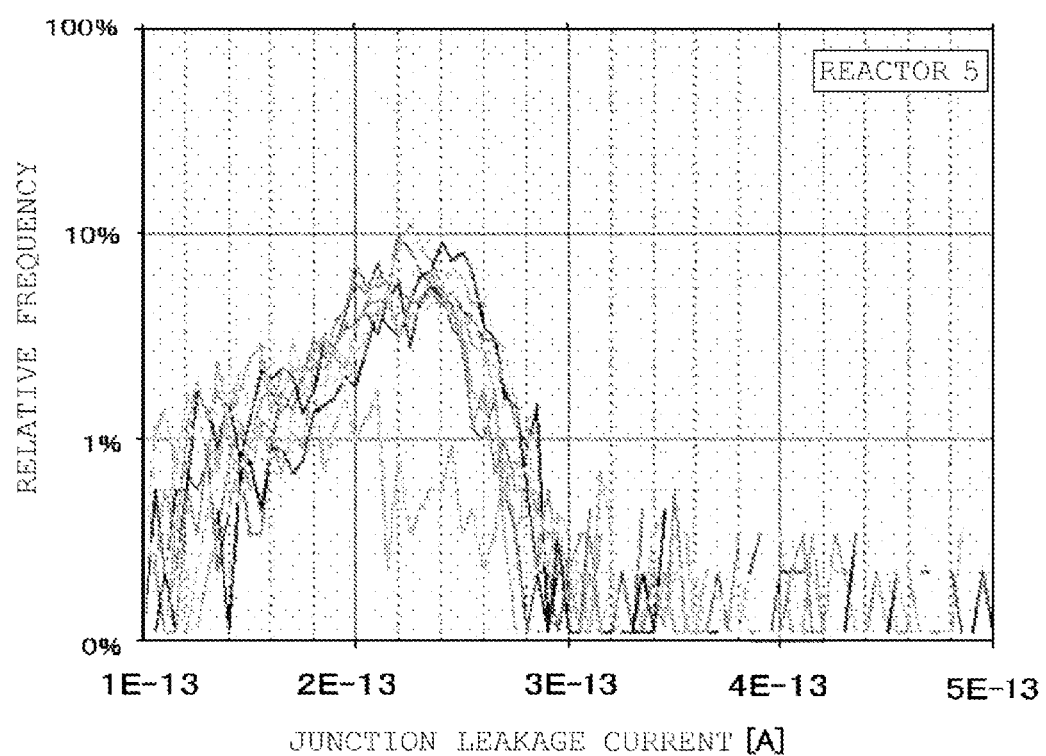
FIG. 6 is a view showing a distribution of junction leakage currents according to Experimental Example 4.

FIG. 6 shows a distribution of junction leakage currents of the wafers which are subjected to the epitaxial growth in the reactor 5.

As shown in FIG. 6, all the wafers show a result that junction leakage current values are approximately $1 \times 10^{-13}$ A to $3 \times 10^{-13}$ A and the junction leakage current values are lower than those in Experimental Example 1 to Experimental Example 3.

Moreover, two similar silicon wafers were prepared, epitaxial growth was performed in the reactor 5 under the same conditions, and surfaces of resultant epitaxial wafers were subjected to chemical analysis.

Consequently, in both the wafers, density of contamination metal did not reach a detection limit ($1 \times 10^7$ atoms/cm$^2$), and no metal was detected.

Thus, as shown in Experimental Example 1 to Experimental Example 3, the association between the distribution of the junction leakage currents and each contamination metallic element can be clarified.

Therefore, measuring a distribution of junction leakage currents of a wafer to be measured in which a contamination element is unknown enables revealing the contamination element from the association relationship.

It is to be noted that the present invention is not restricted to the foregoing embodiment. The foregoing embodiment is an illustrative example, and any example that has substantially the same configuration and exerts the same functions and effects as the technical concept described in claims of the present invention is included in the technical scope of the present invention.

The invention claimed is:

1. A method for evaluating a semiconductor wafer by using junction leakage currents, comprising:
    preparing a reference wafer in which contamination element and amount of contamination are known;
    forming a plurality of cells including p-n junction on the reference wafer;
    measuring junction leakage currents in the plurality of cells on the reference wafer to acquire a distribution of the junction leakage currents of the reference wafer;
    associating the distribution of the junction leakage currents of the reference wafer with a contamination element;
    forming a plurality of cells including p-n junction on a wafer to be measured;
    measuring junction leakage currents in the plurality of cells on the wafer to be measured to acquire a distribution of the junction leakage currents of the wafer to be measured; and
    identifying a contamination element of the wafer to be measured based on the association.

2. The method for evaluating a semiconductor wafer according to claim 1,
    wherein an amount of contamination of the wafer to be measured is $1 \times 10^7$ atoms/cm$^2$ or more and less than $3 \times 10^8$ atoms/cm$^2$ in terms of surface density.

3. The method for evaluating a semiconductor wafer according to claim 1,
    wherein the step of associating includes a phase of associating a peak value of the distribution of the junction leakage currents of the reference wafer with a contamination element.

4. The method for evaluating a semiconductor wafer according to claim 2,
    wherein the step of associating includes a phase of associating a peak value of the distribution of the junction leakage currents of the reference wafer with a contamination element.

5. The method for evaluating a semiconductor wafer according to claim 1,
    wherein the step of associating includes a phase of storing the association between the peak value of the distribution of the junction leakage currents of the reference wafer and the contamination element in a database, and
    the step of identifying a contamination element includes a phase of identifying a contamination element of the wafer to be measured based on the association stored in the database.

6. The method for evaluating a semiconductor wafer according to claim 2,
    wherein the step of associating includes a phase of storing the association between the peak value of the distribution of the junction leakage currents of the reference wafer and the contamination element in a database, and
    the step of identifying a contamination element includes a phase of identifying a contamination element of the wafer to be measured based on the association stored in the database.

7. The method for evaluating a semiconductor wafer according to claim 3,
    wherein the step of associating includes a phase of storing the association between the peak value of the distribution of the junction leakage currents of the reference wafer and the contamination element in a database, and
    the step of identifying a contamination element includes a phase of identifying a contamination element of the wafer to be measured based on the association stored in the database.

8. The method for evaluating a semiconductor wafer according to claim 4,
    wherein the step of associating includes a phase of storing the association between the peak value of the distribution of the junction leakage currents of the reference wafer and the contamination element in a database, and
    the step of identifying a contamination element includes a phase of identifying a contamination element of the wafer to be measured based on the association stored in the database.

* * * * *